(12) United States Patent
Dammel et al.

(10) Patent No.: US 6,852,465 B2
(45) Date of Patent: Feb. 8, 2005

(54) PHOTORESIST COMPOSITION FOR IMAGING THICK FILMS

(75) Inventors: Ralph R. Dammel, Flemington, NJ (US); Stephen Meyer, Tobyhanna, PA (US); Mark A. Spak, Edison, NJ (US)

(73) Assignee: Clariant International Ltd., Muttenz (CH)

( * ) Notice: Subject to any disclaimer, the term of this patent is extended or adjusted under 35 U.S.C. 154(b) by 0 days.

(21) Appl. No.: 10/393,925

(22) Filed: Mar. 21, 2003

(65) Prior Publication Data

US 2004/0185368 A1 Sep. 23, 2004

(51) Int. Cl.$^7$ .............................. G03F 7/023; G03F 7/30
(52) U.S. Cl. ..................... 430/191; 430/192; 430/193; 430/270.1; 430/326
(58) Field of Search ............................... 430/191, 192, 430/193, 270.1, 326

(56) References Cited

U.S. PATENT DOCUMENTS

| | | | |
|---|---|---|---|
| 2,797,213 A | 6/1957 | Moore et al. | 534/557 |
| 3,106,465 A | 10/1963 | Neugebauer et al. | 430/193 |
| 3,130,047 A | 4/1964 | Ublig et al. | 430/193 |
| 3,148,983 A | 9/1964 | Endermann et al. | 430/192 |
| 3,201,329 A | 8/1965 | Burt et al. | 201/27 |
| 3,785,825 A | 1/1974 | Deutsch et al. | 430/165 |
| 3,802,885 A | 4/1974 | Lawson et al. | 430/165 |
| 5,283,374 A | 2/1994 | Jeffries | 568/721 |
| 5,698,362 A | * 12/1997 | Nishi et al. | 430/191 |
| 6,159,656 A | 12/2000 | Kawabe et al. | 430/270.1 |
| 6,423,463 B1 | 7/2002 | Oota et al. | 430/191 |

OTHER PUBLICATIONS

Japanese Abstract, JP95021626–B2, "Resist Composion for LSI Production—Consists of Alkali–soluble Resin, Organic Solvent, Fluoro:chemical Surfactant and Radiation Sensitive Substance".

Gary Solomon, "Electrochemically Deposited Solder Bumps for Wafer–level Packaging", Solid State Technology, Apr. 2001, Chapter 5, pp. 83–88.

Andre Knop and Louis A. Pilato, "Phenolic Resins,", Springer–Verlag Berlin Heidelberg, New York, Tokyo, 1985, pp. 91–102.

Copy of International Search Report for PCT/EP2004/022391.

* cited by examiner

*Primary Examiner*—John S. Chu
(74) *Attorney, Agent, or Firm*—Sangya Jain

(57) ABSTRACT

The present invention relates to a light-sensitive photoresist composition especially useful for imaging thick films, comprising a film-forming alkali-soluble resin, a photoactive compound, and a surfactant at a level ranging from about 2000 ppm to about 14,000 ppm by weight of total photoresist. Preferably the photoresist film has a thickness greater than 20 microns. The invention further provides for a process for coating and imaging the light-sensitive composition of this invention.

20 Claims, 1 Drawing Sheet

A plot of the bake-expose delay time versus the exposure energy to form a pattern, as the surfactant concentration is varied.

PHOTORESIST COMPOSITION FOR IMAGING THICK FILMS

FIELD OF INVENTION

The present invention relates to a light-sensitive photoresist composition especially useful for imaging thick films, comprising a film-forming alkali-soluble resin, a photoactive compound, a solvent and a surfactant at a level ranging from about 2000 ppm to about 14,000 ppm by weight of total photoresist composition. Preferably the photoresist film has a thickness greater than 20 microns. The invention further provides for a process for coating and imaging the light-sensitive composition of this invention.

BACKGROUND OF THE INVENTION

Photoresist compositions are used in microlithography processes for making miniaturized electronic components such as in the fabrication of computer chips and integrated circuits. Generally, in these processes, a coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble in such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution, plasma gases, or have metal or metal composites deposited in the spaces of the substrate where the photoresist coating was removed during development. The areas of the substrate where the photoresist coating still remains are protected. Later, the remaining areas of the photoresist coating may be removed during a stripping operation, leaving a patterned substrate surface. In some instances, it is desirable to heat treat the remaining photoresist layer, after the development step and before the etching step, to increase its adhesion to the underlying substrate.

In the manufacture of patterned structures, such as wafer level packaging, electrochemical deposition of electrical interconnects has been used as the density of the interconnects increases. For example, see Solomon, Electrochemically Deposited Solder Bumps for Wafer-Level Packaging, Packaging/Assembly, Solid State Technology, pages 84–88, April 2001; disclosure of which is incorporated herein by reference. Wafer level packaging produces a chip/die/device that is ready for direct assembly onto the final substrate or final system platform. Wafer-level packaging is used for making electrical connections to an integrated circuit chip above the active circuitry and is especially important as the density of inputs and outputs (I/Os) on chips increases.

Wafer-level packaging schemes use a technique known as redistribution to connect the peripheral pads to an area array of solder bumps on the surface of the wafer. The basic sequence of wafer-level packaging with redistribution involves creating a level of interconnect that defines an under-bump pad that is connected to the peripheral bonding pad. The under-bump pad is exposed by a via in a dielectric layer. Then the entire wafer receives an under-bump metallurgy (UBM) stack that provides an electroplating seed layer on top of a diffusion barrier and adhesion layer. The plating mask is formed in photoresist that can range from about 1 $\mu$m to over 200 $\mu$m thick, but are typically 25–125 $\mu$m thick. Layers exceeding about 100 $\mu$m to about 125 $\mu$m are typically applied in double coats. The solder bump is electroplated within the via in the case when a thicker photoresist is used. The solder bump is typically electroplated above the photoresist when it is <50 $\mu$m thick (overplating or mushroom plating). The photoresist is then stripped and the UBM is etched away everywhere it is not covered by the solder bumps. Finally, the bumps may be reflowed, causing them to reform in the shape of truncated spheres.

Gold bumps, copper posts and copper wires for redistribution in wafer level packaging require a resist mold that is later electroplated to form the final metal structures in advanced interconnect technologies. The resist layers are very thick compared to the photoresists used in the IC manufacturing. Both feature size and resist thickness are typically in the range of 5 $\mu$m to 100 $\mu$m, so that high aspect ratios (resist thickness to line size) have to be patterned in the photoresist.

Devices manufactured for use as microelectromechanical machines also use very thick photoresist films to define the components of the machine.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. Novolaks may also be reacted with quinine diazides and combined with a polymer.

Additives, such as surfactants, are often added to a photoresist composition to improve the coating uniformity of the photoresist film where the film thickness is less than 5 microns, especially to remove striations within the film. Various types of surfactants are added typically at levels ranging from about 5 ppm to about 200 ppm. U.S. Pat. No. 6,159,656 discloses the use of mixtures of surfactants from 0.01 to 2 parts by weight for a deep uv chemically amplified photoresist. These photoresists are used for high resolution deep uv lithography, where typically the film thickness of the photoresist film is less than 1 micron and surfactant levels greater than 100 ppm lead to surface defects, such as voids in the film. JP 95,021,626B2 discloses a novolak based photoresist containing a fluoro-chemical surfactant at 5 ppm.

Certain applications of the electronic industry, as discussed above, require photoresist films that are thicker than those used for high resolution lithography, where these thick films can typically be greater than 20 microns. In thick film applications the physical parameters of coating, baking and development can be quite different from those of thin films. Thick coatings of photoresist can exhibit defects such as, phase separation, striations, formation of microbubbles, etc. which can lead to nonuniform films after coating and also after development. The applicants have found that for photoresists, especially those comprising novolaks and quinone diazides, when these photoresists are coated at film thickness greater than 20 microns, these photoresists exhibit delay time instability. Delay time instability occurs when the thick photoresist films are coated and baked and then left for some extended period of time before they are exposed to irradiation. It has been observed that upon exposure and development of the photoresist film, the energy required to obtain an image increases with increasing delay time between bake and exposure. Delay time instability negatively impacts the device yield of the lithographic process and can lead to high cost of manufacture for these devices.

The applicants of the present invention have unexpectedly found that the surfactant levels that are used for thin film do not give satisfactory coating qualities when used at the same level for thick films; for example, a photoresist manufactured at higher viscosity to coat thicker films than a normal photoresist and containing only 100 ppm of surfactant, exhibits delay time instability. However, it has been further found by the applicants that there is an optimum range of surfactant levels in thick films that provide films with good coating qualities and good lithographic performance.

It is the object of the present invention to provide for a photoresist useful for coating thick films that is free of coating defects, such as striations and voids, and gives good lithographic performance, especially, providing a photoresist that is not sensitive to delay times between baking and exposure.

SUMMARY

Figure 1:
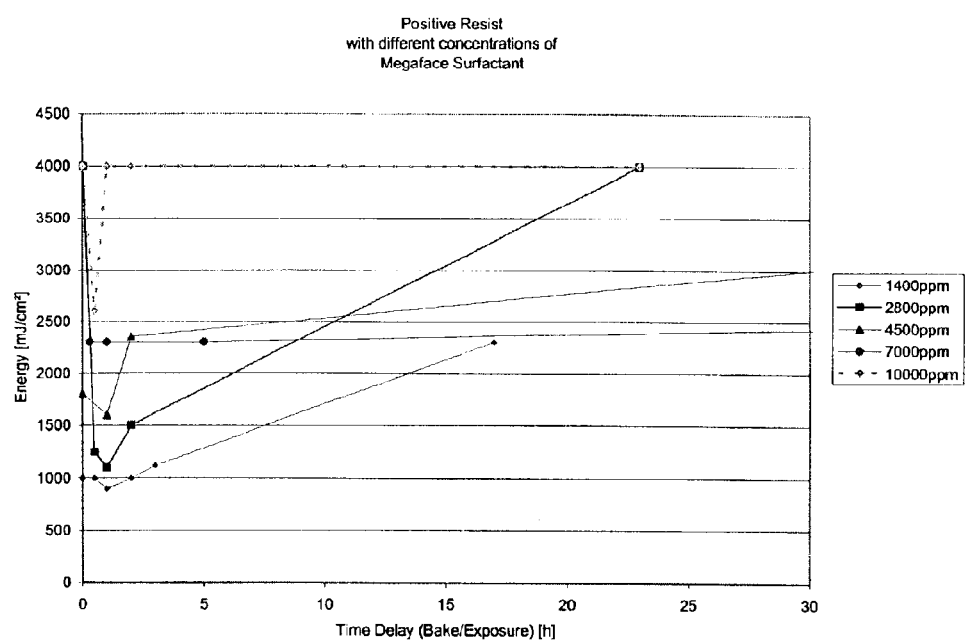
FIG. 1 illustrates a plot of the bake-exposed delay time of the photoresist versus the exposure energy to form a pattern, as the surfactant concentration is varied.

The present invention relates to a photoresist composition especially useful for imaging thick films, comprising an alkali soluble resin, a photoactive compound, a surfactant and a solvent, where the surfactant is at a level ranging from 2000 ppm to 14,000 ppm relative to total weight of the photoresist. The surfactant is preferably a nonionic surfactant, and more preferably a fluorinated and/or a silicone polymer. The film thickness of the photoresist is preferably at least 20 microns. The photoresist is preferably a mixture of a novolak resin, a naphthoquinonediazide and a nonionic surfactant. The invention further relates to a process for imaging the novel photoresist.

DESCRIPTION OF THE INVENTION

The present invention provides for a light-sensitive photoresist composition useful for imaging thick films, comprising a film-forming alkali-soluble resin, a photoactive compound, and a surfactant at a level ranging from about 2000 ppm to about 14,000 ppm by weight of total photoresist. Preferably the photoresist film has a thickness greater than 20 microns. The invention further provides for a process for coating and imaging the light-sensitive composition of this invention.

Alkali soluble resins, such as novolaks and polyhydroxystyrenes, are typically used in photoresist compositions. The production of film forming, novolak resins which may be used for preparing photosensitive compositions, are well known in the art. A procedure for the manufacture of novolak resins is described in Phenolic Resins, Knop A. and Pilato, L.; Springer Verlag, N.Y., 1985 in Chapter 5 which is incorporated herein by reference. The polyhydroxystyrene can be any reference. The polyhydroxystyrene can be any polyhydroxystyrene, including single polymers of vinylphenol; copolymers of vinylphenol and an acrylate derivative, acrylonitrile, a methacrylate derivative, methacrylonitrile, styrene, or a styrene derivative such as alpha-methylstyrene, p-methylstyrene, o-hydrogenated resins derived from single polymers of vinylphenol; and hydrogenated resins derived from copolymers of vinylphenol and the above-described acrylate derivative, methacrylate derivative, or styrene derivative.

The novolak resins typically comprise the addition-condensation reaction product of at least one phenolic compound with at least one aldehyde source. The phenolic compounds include for example cresols (including all isomers), xylenols (such as 2,4-, 2,5-xylenols, 3,5 xylenol, and tri-methyl phenol).

Aldehyde sources that can be used in this invention include formaldehyde, paraformaldehyde, trioxane, acetaldehyde, chloroacetaldehyde, and reactive equivalents of these aldehyde sources. Among these formaldehyde and paraformaldehyde are preferable. In addition mixtures of two or more different aldehydes can be used.

The acid catalyst used for the addition-condensation reaction includes hydrochloric acid, sulfuric acid, formic acid, acetic acid, oxalic acid, p-toluenesulfonic acid and the like.

The photoactive component (hereafter referred to as PAC) can be any compound known to be useful for use in photoresist compositons. Preferably it is diazonaphthoquinone sulfonate ester of a polyhydroxy compound or monohydroxy phenolic compound. Photoactive compounds can be prepared by esterification of 1,2-napthoquinonediazide-5-sulfonyl chloride and/or 1,2-naphthoquinonediazide-4-sulfonyl chloride with a phenolic compound or a polyhydroxy compound having 2–7 phenolic moieties, and in the presence of basic catalyst. The use of o-diazonaphthoquinones as photoactive compounds is well known to the skilled artisan. These sensitizers which comprise a component of the present invention are preferably substituted diazonaphthoquinone sensitizers, which are conventionally used in the art in positive photoresist formulations. Such sensitizing compounds are disclosed, for example, in U.S. Pat. Nos. 2,797,213, 3,106,465, 3,148,983, 3,130,047, 3,201,329, 3,785,825 and 3,802,885. Useful photosensitizers include, but are not limited to, the sulfonic acid esters made by condensing phenolic compounds such as hydroxy benzophenones, oligomeric phenols, phenols and their derivatives, novolaks and multisubstituted-multihydroxyphenyl alkanes with naphthoquinone-(1,2)- diazide-5-sulfonyl chloride or naphtho-quinone-(1,2)-diazide-4-sulfonyl chlorides. In one preferred embodiment monohydroxy phenols such as cumylphenol are preferred.

In another embodiment, preferably, the number of the phenolic moieties per one molecule of the polyhydroxy compound used as a backbone of PAC is in the range of 2–7, and more preferably in the range of 3–5.

Some representative examples of polyhydroxy compounds are:

(a) Polyhydroxybenzophenones such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2'4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, and 2,3,4,3',4',5'-hexahydroxybenzophenone;

(b) Polyhydroxyphenylalkylketones such as 2,3,4-trihydroxyacetophenone, 2,3,4-trihydroxyphenylpentylketone, and 2,3,4-trihydroxyphenylhexylketone;

(c) Bis(polyhydroxyphenyl)alkanes such as bis(2,3,4-trihydroxyphenyl)methane, bis(2,4-dihydroxyphenyl) methane, and bis(2,3,4-trihydroxyphenyl)propane;

(d) Polyhydroxybenzoates such as propyl 3,4,5-trihydroxybenzoate, phenyl 2,3,4-trihydroxybenzoate, and phenyl 3,4,5-trihydroxybenzoate;

(e) Bis(polyhydroxybenzoyl)alkanes or bis(polyhydroxybenzoyl)aryls such as bis(2,3,4-trihydroxybenzoyl)methane, bis(3-acetyl-4,5,6-trihydroxyphenyl)methane, bis(2,3,4-trihydroxybenzoyl)benzene, and bis(2,4,6-trihydroxybenzoyl)benzene;

(f) Alkylene di(polyhydroxybenzoates) such as ethyleneglycol-di(3,5-dihydroxybenzoate) and ethylene glycoldi(3,4,5-trihydroxybenzoate);

(g) Polyhydroxybiphenyls such as 2,3,4-biphenyltriol, 3,4,5-biphenyltriol, 3,5,3'5'-biphenyltetrol, 2,4,2',4'-biphenyltetrol, 2,4,6,3',5'-biphenylpentol, 2,4,6,2',4',6'-biphenylhexol, and 2,3,4,2',3',4'-biphenylhexol;

(h) Bis(polyhydroxy)sulfides such as 4,4'-thiobis(1,3-dihydroxy)benzene;

(i) Bis(polyhydroxyphenyl)ethers such as 2,2'4,4'-tetrahydroxydiphenyl ether;

(j) Bis(polyhydroxyphenyl)sulfoxides such as 2,2'4,4'-tetrahydroxydiphenylsulfoxide;

(k) Bis(polyhydroxyphenyl)sulfones such as 2,2',4,4'-tetrahydroxydiphenylsulfone;

(l) Polyhydroxytriphenylmethanes such as tris(4-hydroxyphenyl)methane), 4,4',4"-trihydroxy-3,5,3',5'-tetramethyltriphenylmethane, 4,4',3",4"-tetrahydroxy-3,5,3',5'-tetramethyltriphenylmethane, 4,4',2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane, and 2,4,6,2',4',6'-hexahydroxy-5,5'-dipropionyltriphenylmethane;

(m) Polyhydroxy-spirobi-indanes such as 3,3,3',3'-tetramethyl-1,1'-spirobi-indane-5,6,5',6'-tetrol, 3,3,3'3'-tetramethyl-1,1'-spirobi-indane-5,6,7,6'6',7'-hexol, and 3,3,3'3'-tetramethyl-1,1'-spirobi-indane-4,5,6,4',5',6'-hexol;

(n) Polyhydroxyphthalides such as 3,3-bis(3,4-dihydroxyphenyl)phthalide, 3,3-bis(2,3,4-trihydroxyphenyl)phthalide, and 3',4',5',6'-tetrahydroxyspiro(phthalide-3,9'-xanthene);

(o) Polyhydroxy compounds described in JP No. 4-253058 such as alpha, alpha' alpha"-tris (4-hydroxyphenyl)-1,3,5-triisopropylbenzene, alpha, alpha', alpha"-tris(3,5-dimethyl-4-hydroxyphenyl)-1,3,5-triisopropylbenzene, alpha, alpha', alpha"-tris(3,5-diethyl-4-hydroxyphenyl)-1,3,5-triisopropylbenzene, alpha, alpha', alpha"-tris(3,5-di-n-propyl-4-hydroxyphenyl)-1,3,5-tri-isopropylbenzene, alpha, alpha',alpha"-tris(3,5-diisopropyl-4-hydroxyphenyl)-1,3,5-triisopropylbenzene, alpha, alpha', alpha"-tris(3,5-di-n-butyl-4-hydroxyphenyl)-1,3,5-triisopropylbenzene, alpha, alpha', alpha"-tris(3-methyl-4-hydroxyphenyl)-1,3,5-triisopropyl-benzene, alpha, alpha', alpha"-tris(3-methoxy-4-hydroxyphenyl)-1,3,5-triisopropylbenzene, alpha, alpha', alpha"-tris(2,4-dihydroxyphenyl)-1,3,5-triisopropylbenzene, 2,4,6-tris(3,5-dimethyl-4-hydroxyphenylthiomethyl)mesitylene, 1-[alpha-methyl-alpha-(4"-hydroxyphenyl)ethyl]-4-[alpha, alpha'-bis(4"-hydroxyphenyl)ethyl]benzene, 1-[alpha-methyl-alpha-(4'-hydroxyphenyl)ethyl]-3-[alpha, alpha'-bis(4"-hydroxy-phenyl)ethyl]benzene, 1-[alpha-methyl-alpha-(3',5'-dimethyl-4'-hydroxyphenyl)ethyl]benzene, 1-[alpha-methyl-alpha-(3'-methoxy-4'-hydroxyphenyl)ethyl]-4-[alpha',alpha'-bis(3'-methoxy-4'-hydroxyphenyl)ethyl]benzene, and 1-[alpha-methyl-alpha-(2',4'-dihydroxyphenyl)ethyl]-4-[alphal ,alpha'-bis(4'-hydroxyphenyl)ethyl]benzene.

Other examples of o-quinonediazide photoactive compounds include condensation products of novolak resins with an o-quinonediazide sulfonyl chloride. These condensation products (also called capped novolaks) may be used instead of o-quinonediazide esters of polyhydroxy compounds or used in combination therewith. Numerous U.S. Patents describe such capped novolaks. U.S. Pat. No. 5,225,311 is one such example. Mixtures of various quinonediazide compounds may also be used.

The photoactive component of the present invention can be any photoactive component known to one of ordinary skill in the art that is useful in photoresist compositions. Although o-quinonediazides are preferred, other photoactive components, such as onium salts, such as iodonium and sulfonium salts, and oxime sulfonates, may also be used. Suitable examples of the acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyidiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide and their homologues are also possible candidates.

It has been found by the applicants that, surprisingly, thick films, particularly those greater than 20 microns and less than 150 microns, require the addition of very specific levels of surfactant to give good lithographic performance. If the level of surfactant is less than about 2000 ppm the thick photoresist film has been found to exhibit phase separation, poor film uniformity, formation of microbubbles during baking, and/or delay time instability. In addition, if the level of surfactant is greater than about 14,000 ppm, the film shows defects, such as voids, and poor photosensitivity. Voids are formed during the coating/baking process where the substrate has regions without the photoresist. Various types of surfactants, especially nonionic, which are compatible with the photoresist, may be used. Typically fluorinated polymers and silicon containing polymers have been found to have desirable properties. Fluorinated and/or silicone polymeric surfactants such as those available commercially are surprisingly extremely effective. Suitable nonlimiting examples include those fluorosurfactants available from Dupont under the name "ZONYL®", those available from Dainippon Ink & Chemicals, Inc., under the name "MEGAFACE™", and those available from 3M under the name "FLUORAD™".

The silicone polymers include without limitation polyether modified silicones and polydimethylsiloxane (PDMS) materials, including silicone-urethane copolymers. Both "reactive" modified and "nonreactive" modified PDMS polymers can be used. Silicon based polymers are commercially available from Dinichiseika Color and Chemicals MFG Co. Ltd. (DNS), and from Polyurethane Specialties Co. Inc. Polyether modified silicones are available from Advanced Polymer, Inc.

Additionally, other surfactants are also useful, such as other nonionic surfactants, examples of which include, but are not limited to, alkyl ethoxylated surfactants, block copolymer surfactants, and sorbitan ester surfactants as well as those well known to those skilled in the art. One type of nonionic surfactant is alkyl alkoxylated surfactant, such as addition products of ethylene oxide, or propylene oxide, with fatty alcohols, fatty acids, fatty amines, etc. Optionally, addition products of mixtures of ethylene oxide and propylene oxide with fatty alcohols, fatty acids, fatty amines can be used.

Mixtures of surfactants described above may also be used. The preferred surfactants are fluorinated and/or silicon polymeric surfactants. It has been found that surfactant levels within a very specific range give the desired coating and processing properties, especially for novolak/diazonaphthoquinone photoresists used to form thick films. The preferred level of the surfactant in the photoresist composition is dependent on the type of photoresist components and the thickness of the photoresist film, but typically for films greater than 20 microns, preferred levels range from about 2,000 ppm to about 14,000 ppm, more preferably from about 2,500 ppm to about 10,000 ppm, even more preferably from about 3,000 ppm to about 8,000 ppm. Thick films in the range of about 20 microns to about 150 microns, preferably those in the range of about 25 microns to about 100 microns, and more preferably those in the range of about 30 microns to about 80 microns particularly benefit from these high levels of surfactant concentration.

In the preferred embodiment, the solid parts of the photoresist composition preferably range from 95% to about 40% resin with from about 5% to about 50% photoactive component. A more preferred range of resin would be from about 50% to about 90% and most preferably from about 65% to about 85% by weight of the solid photoresist components. A more preferred range of the photoactive component would be from about 10% to about 40% and most preferably from about 15% to about 35%, by weight of the solid in the photoresist. In manufacturing the photoresist composition, the resin, the photoactive component, and the surfactant are mixed with the solvent, such that the solvent mixture is present in an amount of from about 30% to about 80% by weight of the overall photoresist composition. A more preferred range is from about 40% to about 70% and most preferably from about 45% to about 60% by weight of the overall photoresist composition.

Other additives such as colorants, non-actinic dyes, plasticizers, adhesion promoters, coating aids, sensitizers, crosslinking agents, and speed enhancers may be added to the solution of resin, photoactive component, surfactant and solvent system before the solution is coated onto a substrate. Surfactants may also be added to negative photoresists comprising an alkali soluble resin, photoactive compound, and a crosslinking agent.

Suitable solvents for photoresists may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The prepared photoresist composition solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include, without limitation, silicon, aluminum, polymeric resins, silicon dioxide, metals, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to aluminum/aluminum oxide coated wafers, such as are utilized in the production of microprocessors and other miniaturized integrated circuit components. A silicon/silicon dioxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 150° C. for from about 30 seconds to about 6 minutes on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a coating of photoresist composition, on the order of 20–150 microns (micrometer) in thickness, remains on the substrate. Multiple coatings may be done to achieve thick films. In a preferred embodiment the temperature is from about 95° C. to about 135° C. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm (nanometers) to about 450 nm, x-ray, electron beam, ion beam or laser radiation, in any desired pattern, produced by use of suitable masks, negatives, stencils, templates, etc. Generally, thick photoresist films are exposed using broadband radiation, using equipments such as Ultratech, Karl Süss or Perkin Elmer broadband exposure tools, although 436 nm and 365 nm Steppers may also be used.

The photoresist is then optionally subjected to a post exposure second baking or heat treatment either before or after development. The heating temperatures may range from about 90° C. to about 150° C., more preferably from about 100° C. to about 140° C. The heating may be conducted for from about 30 seconds to about 3 minutes, more preferably from about 60 seconds to about 2 minutes on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One preferred hydroxide is tetramethyl ammonium hydroxide. Other preferred bases are sodium or potassium hydroxide. Additives, such as surfactants, may be added to the developer. After removal of the coated wafers from the developing solution, one may conduct an optional post-development heat treatment or bake to increase the coating's adhesion and density of the photoresist. The imaged substrate may then be coated with metals, or layers of metals to form bumps as is well known in the art, or processed further as desired.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE

A photoresist solution of 37.22 g novolak resin and 4.8 g of a reaction product of 2,1,5-diazonaphothoquinone with 2,3,4-trihydroxybenzophenone in 57.3 g of propyleneglycol monomethylether acetate was mixed and the solution was then filtered. The photoresist solution was divided up into several aliquots and the surfactant Megaface R08 (available from Dianippon Ink and Chemicals Inc., 222 Bridge Plaza South, Fort Lee, N.J.) was added at differing concentrations of 1400, 2800, 4500, and 7000 ppm relative to the total photoresist composition.

The photoresist solutions from above were coated onto several 4 inch silicon wafers and baked at 125° C. for 180 seconds to give a coating of 65 microns. For each of the different surfactant concentrations, one wafer was exposed immediately and the others were exposed with different delay times between baking and exposure of up to 30 hours. The wafers were exposed through an Optoline mask on a Perkin Elmer broadband exposure tool and developed immediately after exposure using AZ 421K developers (available from Clariant Corporation, 70 Meister Ave, Somerville, N.J.) with a 6 minute spray at 400 rpm. The exposure energy to clear the pattern on the mask was calculated for each wafer. The development process was repeated for the different surfactant concentrations.

The results are presented in FIG. 1. It can be clearly seen in FIG. 1 that fluctuations are present in the first 30 minutes to an hour before the exposure energy value stabilizes. The optimum range of surfactant concentrations for this photoresist formulation is between 4,000 ppm and 8,000 ppm, where the exposure energy change was acceptably stable over time whilst retaining good coating qualities. Below 2,800 ppm the exposure dose had not stabilized and at 10,000 ppm the exposure dose was too high.

What is claimed is:

1. A coated substrate especially useful for imaging thick films, comprising a substrate with a photoresist coating film, wherein the photoresist coating film is formed from a photoresist composition comprising an alkali soluble resin, a photoactive compound, a surfactant and a solvent, where the surfactant is at a level ranging from 2000 ppm to 14,000 ppm relative to total weight of the photoresist, further wherein the thickness of the photoresist coating film is greater than 20 microns.

2. The photoresist according to the composition of claim 1, where the surfactant is a nonionic surfactant.

3. The photoresist according to the composition of claim 1, where the surfactant is a fluorinated and/or a silicone polymer.

4. The photoresist according to the composition of claim 1, where the resin is selected from a novolak resin and a polyhydroxystyrene resin.

5. The photoresist according to the composition of claim 1, where the photoactive compound is a reaction product of a 2,1,5-, or 2,1,4-diazonaphthoquinone compound and a hydroxy containing compound.

6. The photoresist according to the composition of claim 1, where the film has a thickness less than 150 microns.

7. The photoresist according to the composition of claim 1, where the composition further comprises a crosslinking agent.

8. A process for imaging a photoresist coating comprising the steps of:
   a) forming on a substrate a photoresist coating, wherein the photoresist coating is formed from a photoresist composition comprising an alkali soluble resin, a photoactive compound, a surfactant and a solvent, where the surfactant is at a level ranging from 2000 ppm to 14,000 ppm relative to total weight of the photoresist, further where the thickness of the photoresist layer is greater than 20 microns
   b) image-wise exposing the photoresist coating;
   c) optionally, postexposure baking the photoresist coating; and d) developing the photoresist coating with an aqueous alkaline solution.

9. The process according to claim 8, where the aqueous alkaline solution comprises a base selected from tetramethylammonium hydroxide, sodium hydroxide and potassium hydroxide.

10. The process according to claim 8, where the aqueous alkaline solution further comprises a surfactant.

11. A photoresist composition especially useful for imaging thick films, comprising an alkali soluble resin, a photoactive compound, a surfactant, a crosslinking agent and a solvent, where the surfactant is at a level ranging from 2000 ppm to 14,000 ppm relative to total weight of the photoresist.

12. The photoresist according to the composition of claim 11, where the surfactant is a nonionic surfactant.

13. The photoresist according to the composition of claim 11, where the surfactant is a fluorinated and/or a silicone polymer.

14. The photoresist according to the composition of claim 11, where the resin is selected from a novolak resin and a polyhydroxystyrene resin.

15. The photoresist according to the composition of claim 11, where the photoactive compound is a reaction product of a 2,1,5-, or 2,1,4-diazonaphthoquinone compound and a hydroxyl containing compound.

16. The photoresist according to the composition of claim 11, where the film has a thickness greater than 20 microns.

17. The photoresist according to the composition of claim 11, where the film has a thickness less than 150 microns.

18. A process for imaging a photoresist composition comprising the steps of:

a) forming on a substrate a photoresist coating from the photoresist composition of claim 11;

b) image-wise exposing the photoresist coating;

c) optionally, postexposure baking the photoresist coating; and d) developing the photoresist coating with an aqueous alkaline solution.

19. The process according to claim 18, where the aqueous alkaline solution comprises a base selected from tetramethylammonium hydroxide, sodium hydroxide and potassium hydroxide.

20. The process according to claim 18, where the aqueous alkaline solution further comprises a surfactant.

* * * * *